(12) United States Patent
Chang

(10) Patent No.: US 8,110,840 B2
(45) Date of Patent: Feb. 7, 2012

(54) LIGHT EMITTING APPARATUS AND METHOD FOR THE SAME

(75) Inventor: Jung-Chien Chang, Xinzhuang (TW)

(73) Assignee: Mutual-Tek Undustries Co., Ltd., Taipei County, Xinzhuang (TW)

( * ) Notice: Subject to any disclaimer, the term of this patent is extended or adjusted under 35 U.S.C. 154(b) by 0 days.

(21) Appl. No.: 12/834,202

(22) Filed: Jul. 12, 2010

(65) Prior Publication Data

US 2010/0276718 A1 Nov. 4, 2010

Related U.S. Application Data

(62) Division of application No. 11/851,171, filed on Sep. 6, 2007, now abandoned.

(30) Foreign Application Priority Data

Sep. 12, 2006 (TW) .............................. 95133609 A

(51) Int. Cl.
*H01L 21/02* (2006.01)
(52) U.S. Cl. ...... 257/89; 257/88; 257/103; 257/E23.119; 257/E33.072; 257/E33.074
(58) Field of Classification Search ............ 257/89–103, 257/E23.119, 33.072–33.074
See application file for complete search history.

(56) References Cited

U.S. PATENT DOCUMENTS

| | | | |
|---|---|---|---|
| 4,945,348 A | 7/1990 | Ibamoto et al. | |
| 5,019,808 A | 5/1991 | Prince et al. | |
| 5,283,675 A | 2/1994 | Ooi et al. | |
| 5,754,260 A | 5/1998 | Ooi et al. | |
| 5,813,753 A * | 9/1998 | Vriens et al. ................... | 362/293 |
| 5,831,774 A | 11/1998 | Toshima et al. | |
| 5,852,514 A | 12/1998 | Toshima et al. | |
| 5,959,316 A * | 9/1999 | Lowery ........................... | 257/98 |
| 6,084,250 A * | 7/2000 | Justel et al. ..................... | 257/89 |
| 6,147,723 A | 11/2000 | Mochizuki | |
| 6,155,699 A * | 12/2000 | Miller et al. ................... | 362/293 |
| 6,246,123 B1 * | 6/2001 | Landers et al. ............... | 257/787 |
| 6,252,254 B1 * | 6/2001 | Soules et al. ................... | 257/89 |
| 6,447,134 B1 | 9/2002 | Takahashi et al. | |
| 6,459,461 B1 | 10/2002 | Umemoto et al. | |
| 6,580,097 B1 * | 6/2003 | Soules et al. ................... | 257/100 |
| 6,746,295 B2 * | 6/2004 | Sorg ................................ | 445/24 |
| 6,831,711 B2 | 12/2004 | Choi et al. | |
| 7,054,049 B2 | 5/2006 | Murakami et al. | |
| 7,185,995 B2 | 3/2007 | Hatanaka et al. | |
| 7,218,450 B2 | 5/2007 | Ahn et al. | |
| 7,248,315 B2 | 7/2007 | Arai et al. | |
| 7,259,803 B2 | 8/2007 | Akada et al. | |
| 7,268,443 B2 | 9/2007 | Kikuchi et al. | |

(Continued)

OTHER PUBLICATIONS

Non-Final Office Action from U.S. Appl. No. 11/851,171 dated Jun. 1, 2009.
Final Office Action from U.S. Appl. No. 11/851,171 dated Mar. 12, 2010.

(Continued)

*Primary Examiner* — Michael Lebentritt
(74) *Attorney, Agent, or Firm* — Snell & Wilmer L.L.P.

(57) ABSTRACT

A light emitting apparatus includes a patterned conductive layer, a light emitting device on the patterned conductive layer, and a first light diffusion layer. The light emitting device and the patterned conductive layer are embedded in the first light diffusion layer. A method of forming such a light emitting apparatus is also disclosed.

13 Claims, 8 Drawing Sheets

U.S. PATENT DOCUMENTS

| | | | |
|---|---|---|---|
| 7,399,995 B2 * | 7/2008 | Yu | 257/98 |
| 7,474,050 B2 | 1/2009 | Kaneda et al. | |
| 7,517,728 B2 * | 4/2009 | Leung et al. | 438/122 |
| 7,737,636 B2 * | 6/2010 | Li et al. | 313/512 |
| 2008/0137202 A1 | 6/2008 | Hsu et al. | |
| 2009/0130340 A1 | 5/2009 | Chang | |

* cited by examiner

LIGHT EMITTING APPARATUS AND METHOD FOR THE SAME

RELATED APPLICATION

This application is a divisional application of U.S. Ser. No. 11/851,171 entitled "LIGHT EMITTING APPARATUS AND METHOD FOR THE SAME," filed on Sep. 6, 2007, which application claims the right of priority based on Taiwan Patent Application No. 095133609 entitled "LIGHT EMITTING APPARATUS AND METHOD FOR THE SAME," filed on Sep. 12, 2006, both of which are incorporated herein by reference and assigned to the assignee hereof.

TECHNICAL FIELD

The present invention relates to a light emitting apparatus, and more particularly, to a light emitting apparatus with a light diffusion layer.

BACKGROUND OF THE INVENTION

In general, liquid crystal displays require light emitting apparatus to provide sufficient and uniformly distributed lights for displaying images, and such a light emitting apparatus is generally referred to as a backlight module. FIG. 1 illustrates a schematic view of a conventional backlight module 100. As shown in FIG. 1, the backlight module 100 includes a light source 110, a housing 120 covering the light source 110, a reflective layer 121 coated on the housing 120, a diffusion plate 130, and various optical films 140. The manufacture of the backlight module 100 includes mounting the light source 120 on a predetermined position of the housing 120, placing the diffusion plate 130 over the light source 110, and then attaching required optical films 140 on the light diffusion plate 130.

Though the conventional light emitting apparatus may provide sufficient light, its thickness is considerably significant. Consequently, it is not practical to apply such a bulky light emitting apparatus to portable electronic devices, which are aimed to be smaller and lighter. Therefore, there is a need to provide a light emitting apparatus to fit the urge of modern life.

SUMMARY OF THE INVENTION

The present invention implements injection mold techniques to provide a light emitting apparatus with a light source embedded in a light diffusion layer, so that the thickness of the light emitting apparatus can be significantly reduced.

One aspect of the present invention is to provide a light emitting apparatus including a patterned conductive layer, a light emitting device on the patterned conductive layer, and a light diffusion layer. The light emitting device and the patterned conductive layer are embedded in the light diffusion layer.

Another aspect of the present invention is to provide a method of forming a light emitting apparatus including providing a substrate; forming a patterned conductive layer on the substrate; disposing a light emitting device on the patterned conductive layer; and forming a first light diffusion layer covering the substrate so that the light emitting device and the patterned conductive layer are embedded in the first light diffusion layer.

DETAILED DESCRIPTION OF THE PREFERRED EMBODIMENTS

Figure 1:
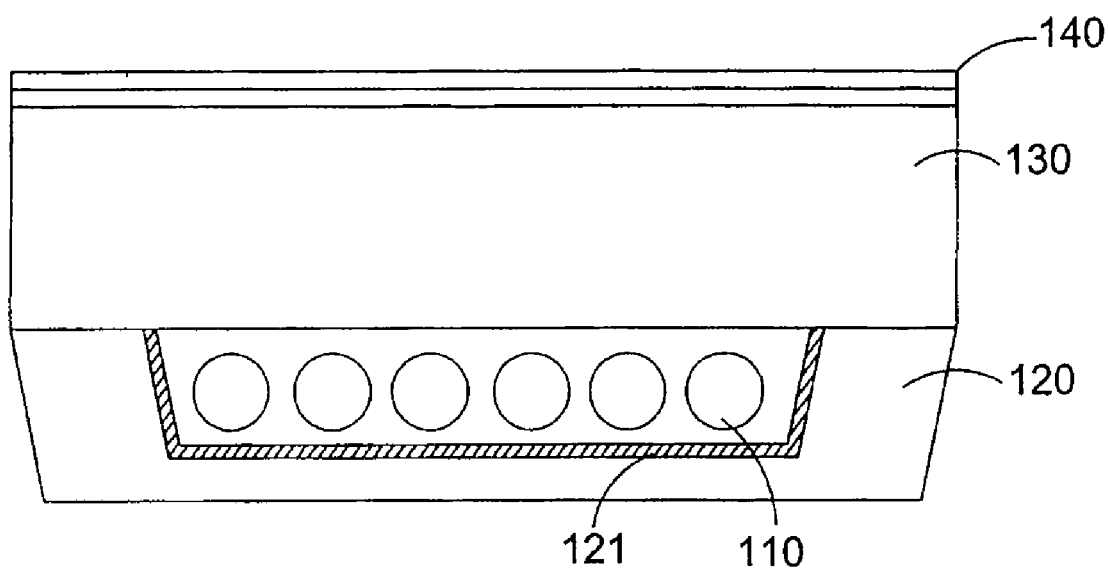
FIG. 1 illustrates a cross-sectional view of a conventional light emitting apparatus.

The preferred embodiments of the present invention will now be described in greater detail by referring to the drawings accompanied in the present application. It should be noted that the features illustrated in the drawings are not necessarily drawn to scale, and similar reference numerals are designated to similar elements. Descriptions of well-known components, materials, and process techniques are omitted so as not to unnecessarily obscure the embodiments of the invention.

Figure 2A:
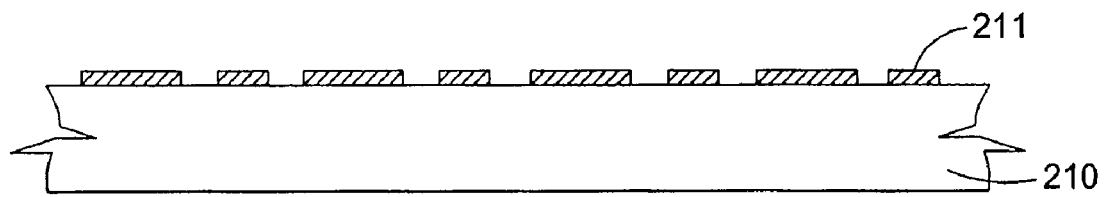
FIGS. 2A to 2J illustrate cross-sectional views of a process flow of forming a light emitting apparatus in accordance with a first embodiment of the present invention.
Figure 2B:
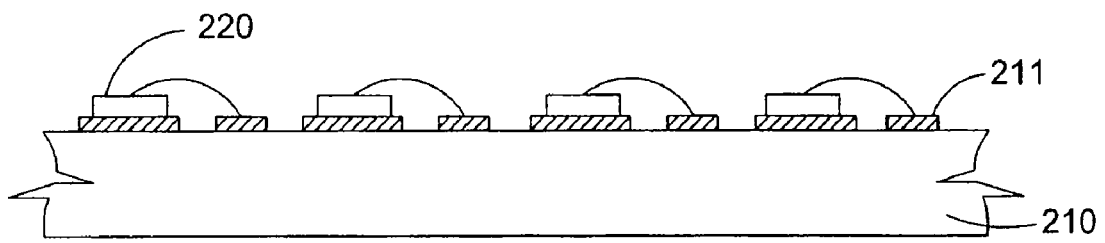
Figure 2C:
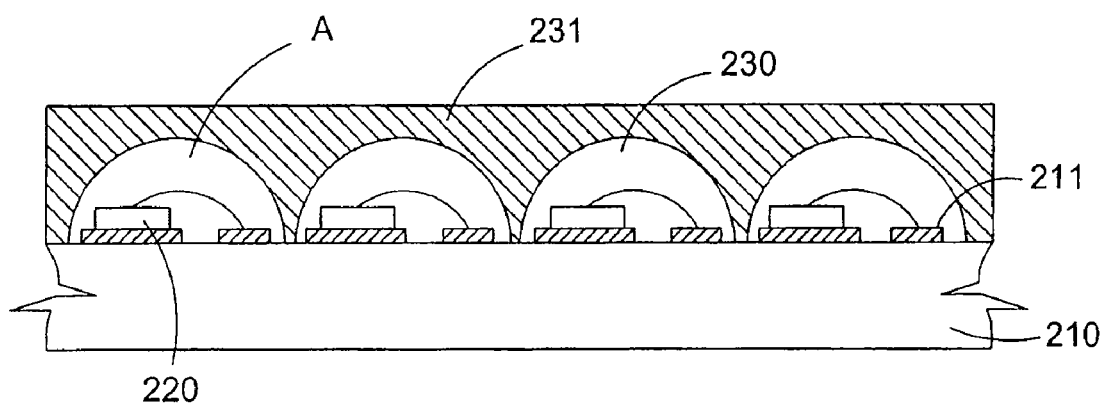
Figure 2D:
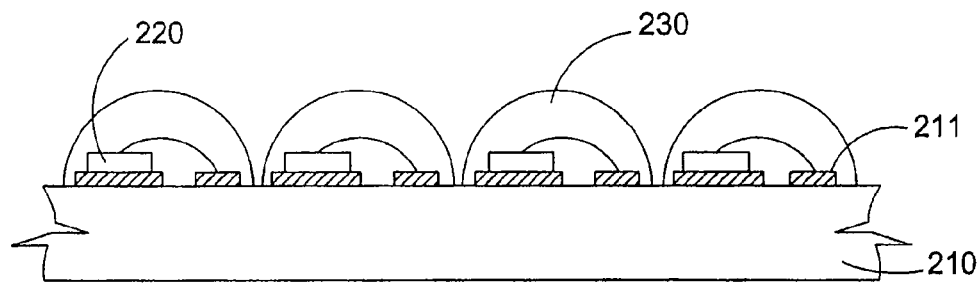
Figure 2E:
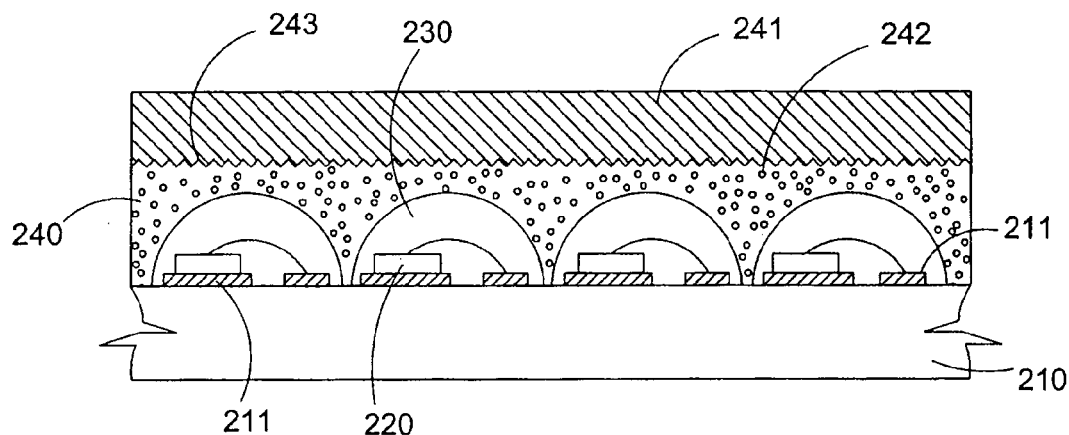
Figure 2F:
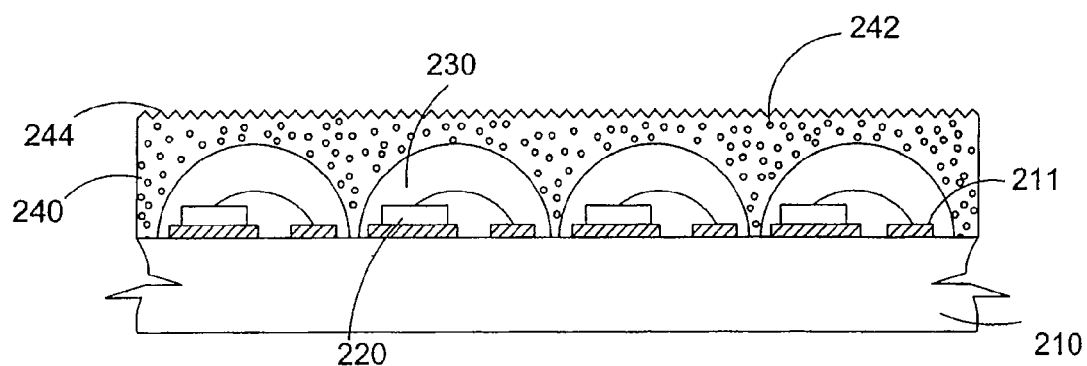
Figure 2G:
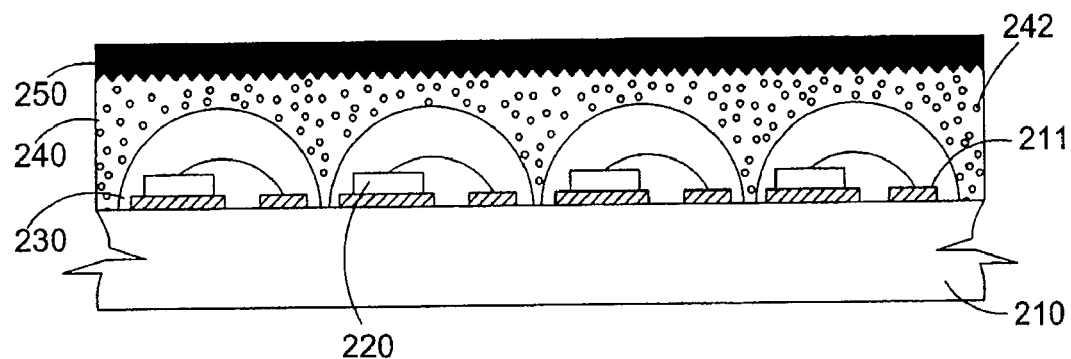
Figure 2H:
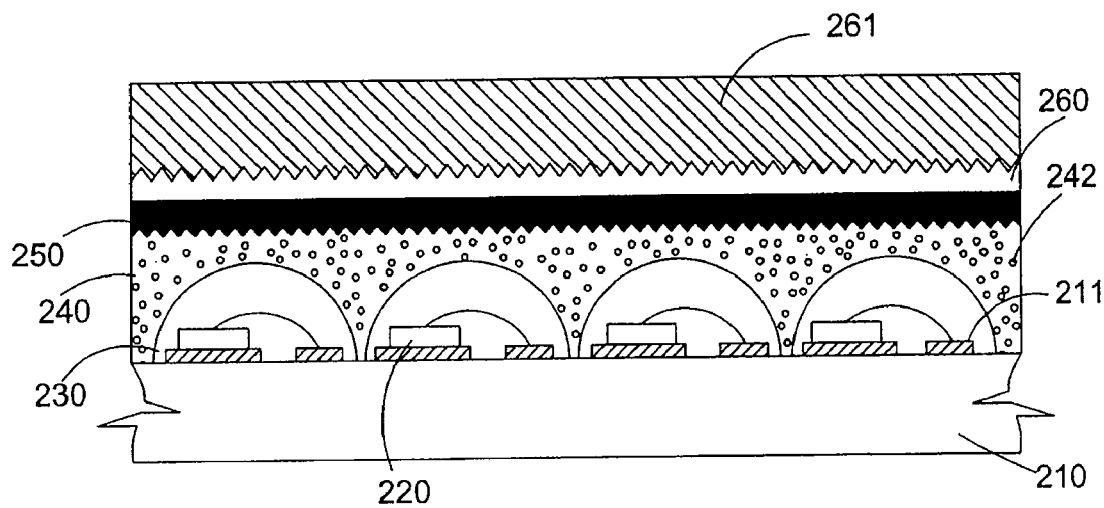
Figure 2I:
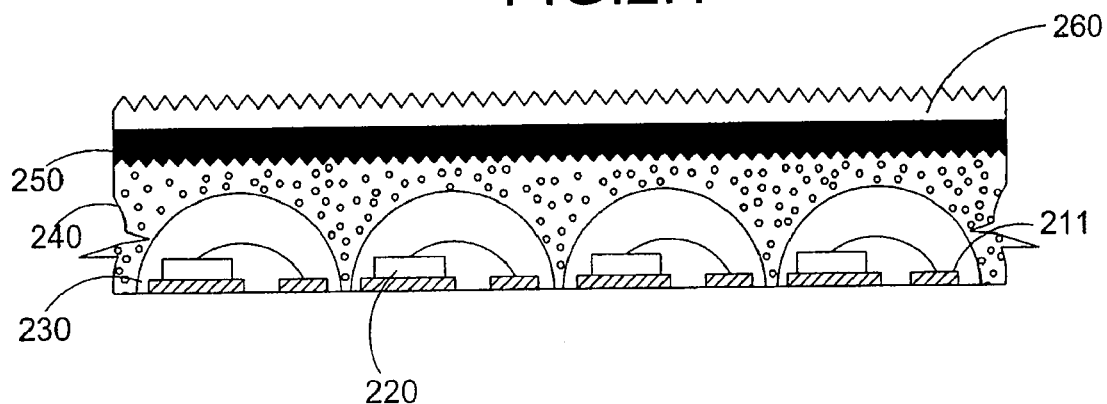
Figure 2J:
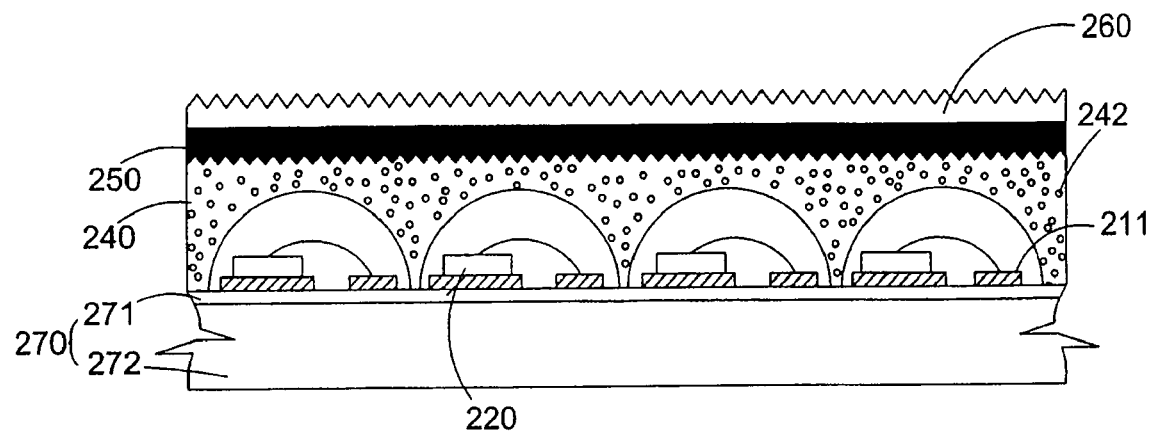
Figure 2K:
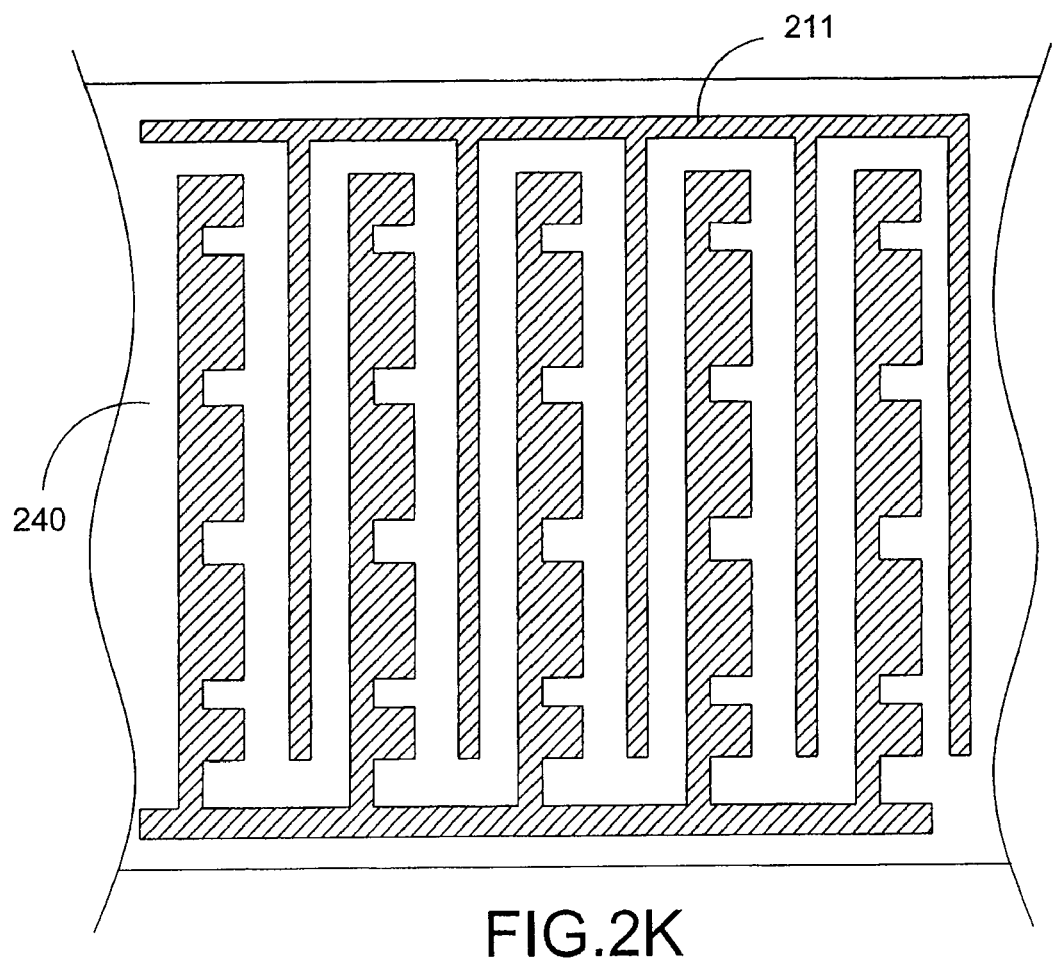
FIG. 2K illustrates a bottom view of the structure shown in FIG. 2I.

FIGS. 2A to 2J illustrate cross-sectional views of a process flow of forming a light emitting apparatus in accordance with a first embodiment of the present invention, and FIG. 2K illustrates a bottom view of the structure shown in FIG. 2I.

Referring to FIG. 2A, a substrate 210 is provided, and a patterned conductive layer 211 is formed on the substrate 210. In this embodiment, the substrate 210 can be a substrate made of conductive material, such as a steel plate or a copper plate, and the thickness of the substrate 210 can be varied as necessary. The patterned conductive layer 211 can be formed by conventional techniques, such as lithography, press printing, or screen printing. For example, a patterned photoresist layer (not shown) can be formed on the substrate 210 to serve as a mask, and by electroplating a conductive material on the masked substrate and removing the patterned photoresist layer after the plating process, the patterned conductive layer 211 is formed on the substrate 210. The material of the patterned conductive layer 211 can be copper or any other suitable conductive material, and the thickness of the patterned conductive layer 211 is not critical, for example, typically between about 0.2 mil and about 2 mil.

Referring to FIG. 2B, a light emitting device 220 is disposed on a predetermined position of the conductive layer 211 and wire-bonded to electrically couple with the conductive layer 211. In this embodiment, the light emitting device 220 can be a light emitting diode, and preferably a light emitting diode chip.

Referring to FIGS. 2C and 2D, a light-transparent layer 230 is formed to cover the light emitting device 220. The light-transparent layer 230 can be a spherical or non-spherical lens covering the light emitting device 220. For example, the light-transparent layer 230 can be formed by utilizing a first injection mold 231 covering the light emitting device 220 with a cavity (A) therein, and then a molding material is injected into the cavity (A) to form the light-transparent layer 230. Any light-transparent material suitable for the molding process can be implemented to form the light-transparent layer 230. For example, the material of the light-transparent layer 230 can be epoxy, silicone, acrylic resin, or fluorinated resin, and preferably silicone. Please note that the profile of the light-transparent layer 230 is defined by the shape of the cavity (A) created by the first injection mold 231. As shown in FIG. 2C, the light-transparent layer 230 is a lampshade like structure, e.g. an arc structure, and can prevent the light emitting device 220 from damage in subsequent processes. Alternatively, fluorescent powders can be added into the light-transparent layer 230 to adjust the color of light. In this embodiment, the thickness of the light-transparent layer 230 is smaller than about 0.5 mm, and preferably between 0.4 mm and 0.2 mm. FIG. 2D illustrates a structure with the light-transparent layer 230 after the first injection mold 231 is removed.

Referring to FIGS. 2E and 2F, a first light diffusion layer 240 is formed covering the substrate 210, so that the light-transparent layer 230, the light emitting device 220, and the patterned conductive layer 211 are embedded in the first light diffusion layer 240. The first light diffusion layer 240 can be formed in a similar way as the light-transparent layer 230. For example, the substrate 210 is disposed in a second injection mold 241, and a molding material is injected to form the light diffusion layer 240. By utilizing the molding technique, the light diffusion layer 240 is formed over the substrate 210 and covers the light-transparent layer 230, the light emitting device 220, and the patterned conductive layer 211, i.e. has the light-transparent layer 230, the light emitting device 220 and the patterned conductive layer 211 embedded therein. The light diffusion layer 240 can be made of any suitable material, such as polycarbonate, acrylate resin, copolymer of methyl acrylate and styrene, cyclic olefin copolymer, poly ethylene terephthalate and polystyrene etc., and preferably cyclic olefin copolymer. Optionally, light diffusion particles 242 can be added into the first light diffusion layer 240 so as to enhance the light diffusion effect. The light diffusion particles 242 may include a material selected from a group consisting of $TiO_2$, $SiO_2$, acrylate resin, polystyrene, and the combination thereof. The amount of light diffusion particles 242 in the first light diffusion layer 240 is about 1 wt % to 5 wt %. FIG. 2F illustrates a structure with the light diffusion layer 240 after the second injection mold 241 is removed. Similarly, the profile of the light diffusion layer 240 can be varied by modifying the design of the second injection mold 241. As shown in FIG. 2E, the second injection mold is designed with a rough surface 243 facing the space where the first light diffusion layer 240 is to be formed. And accordingly, the first light diffusion layer 240 is formed with a rough surface 244 corresponding to the rough surface 243. The rough surface 244 can enhance the light diffusion effect. Please note that the rough surface 244 is optionally formed and can be formed by other techniques, such as plasma bombardment technique, or printing technique, according to different design needs. For example, the plasma bombardment process can create a surface of a finer roughness. Please note that the substrate 210 will be removed in a later process, so the first light diffusion layer 240 should have a sufficient thickness to serve as a carrier supporting the patterned conductive layer 211, the light emitting device 220, the light-transparent layer 230, and other optical films, if such exist. For example, in this embodiment, the thickness of the first light diffusion layer 240 is less than 3 mm, and preferably between 2 mm and 1 mm.

Referring to FIG. 2G, a second light diffusion layer 250 is optionally formed to cover the first light diffusion layer 240. In this embodiment, a material similar to light diffusion particles 242 described above may be deposited on the first light diffusion layer 240 by physical or chemical evaporation to form the second light diffusion layer 250. If the first light diffusion layer 240 produces sufficient diffusion effect, the second light diffusion layer 250 may be omitted.

Referring to FIGS. 2H and 2I, a prism layer 260 is formed over the substrate 210 covering the first light diffusion layer 240 and the second diffusion layer 250. Then, the substrate 210 is removed to expose the patterned conductive layer 211. Similarly, the prism layer 260 can be formed by utilizing a third injection mold 261, injecting a molding material, and removing the third injection mold 261. The prism layer 260 may include a material selected from a group consisting of polycarbonate, acrylate resin, copolymer of methyl acrylate and styrene, cyclic olefin copolymer, poly ethylene terephthalate and polystyrene etc., and preferably cyclic olefin copolymer. FIG. 2I illustrates a structure with the prism layer 260 after the first injection mold 261 is removed. Similarly, the profile of the prism layer 260 may also be defined by the third injection mold 261 to meet the design needs.

The structure formed by three injection molds in FIG. 2I includes the prism layer 260, the second diffusion layer 250, the first diffusion layer 240, the light-transparent layer 230, the light emitting device 220, and the patterned conductive layer 211, which are integrated as the light emitting apparatus. Particularly, the light emitting device 220 and the patterned conductive layer 211 are embedded in the first diffusion layer 240. Different from the conventional light emitting apparatus of FIG. 1, the light emitting apparatus of the present invention eliminates the needs of the housing 120 and the reflective layer 121 thereon, and accordingly, the thickness is significantly reduced. Please note that the term "embedded" indicates that at least a portion of the light emitting device 220 and at least a portion of the patterned conductive layer 211 are buried in the first light diffusion layer 240.

FIG. 2I shows a preferred embodiment that the entire light emitting device 220 and the patterned conductive layer 211 are buried in the first light diffusion layer 240, and the bottom surface of the patterned conductive layer 211 is substantially coplanar with the bottom surface of the first light diffusion layer 240. The light emitting apparatus of the present invention not only has the advantage of reduced thickness, but also benefits the product manufacturers (such as liquid crystal display or mobile device manufacturers) in the feasibility of assembly and the simplification of the production flow, in turn, increasing the productivity.

Before referring to FIG. 2J, a bottom view of the light emitting apparatus of FIG. 2I is shown in FIG. 2K. As shown in FIG. 2K, the substrate 210 is removed to expose the patterned conductive layer 211 so as to facilitate the improvement of heat dissipation. Furthermore, as shown in FIG. 2J, a heat dissipation element 270, such as a heat dissipation glue 271 or a heat dissipation plate 272, may optionally contact the exposed surface of the patterned conductive layer 211 to improve the heat dissipation ability of the light emitting apparatus.

Figure 2L:
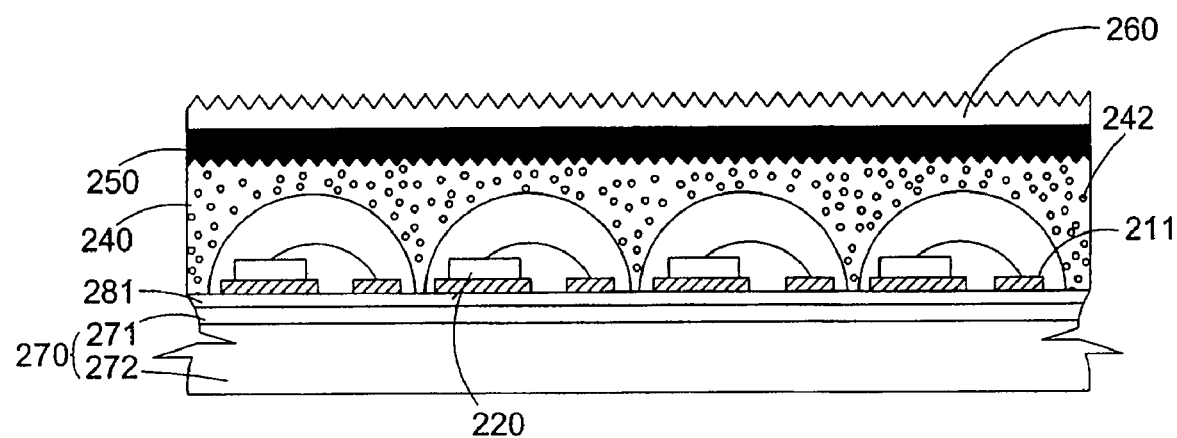
FIG. 2L illustrates a preferred structure by adding a reflective layer to the structure shown in FIG. 2J.

FIG. 2L shows another preferred example of the first embodiment. Different from

FIG. 2J, the structure of FIG. 2L further includes a reflective layer 281 between the bottom surface of the structure of FIG. 2I and the heat dissipation element 270. The reflective layer 281 is used for reflecting light toward the bottom surface of the structure of FIG. 2I so as to prevent the light from dissipating or being absorbed by the heat dissipation element 270 or any other components. The reflective layer 281 will enhance the brightness and the light uniformity of the light emitting apparatus. The reflective layer 281 can be made of any suitable reflective materials and the fluorescent materials are preferred.

Figure 3A:
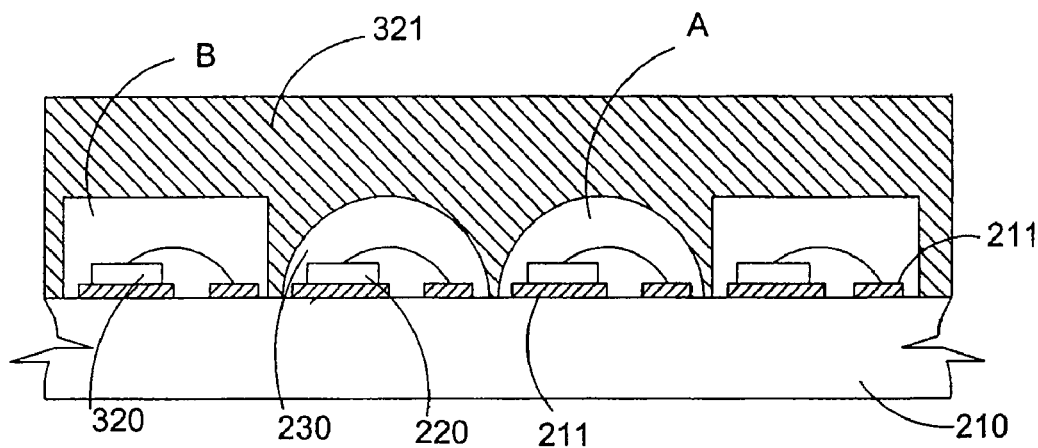
FIGS. 3A to 3C illustrate cross-sectional views of a process flow of forming a light emitting apparatus in accordance with a second embodiment of the present invention.
Figure 3B:
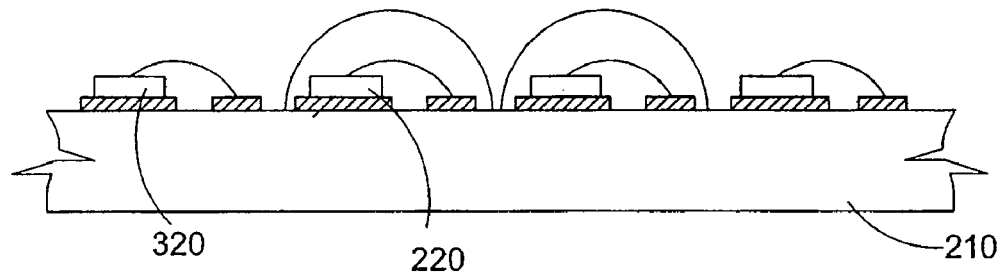
Figure 3C:
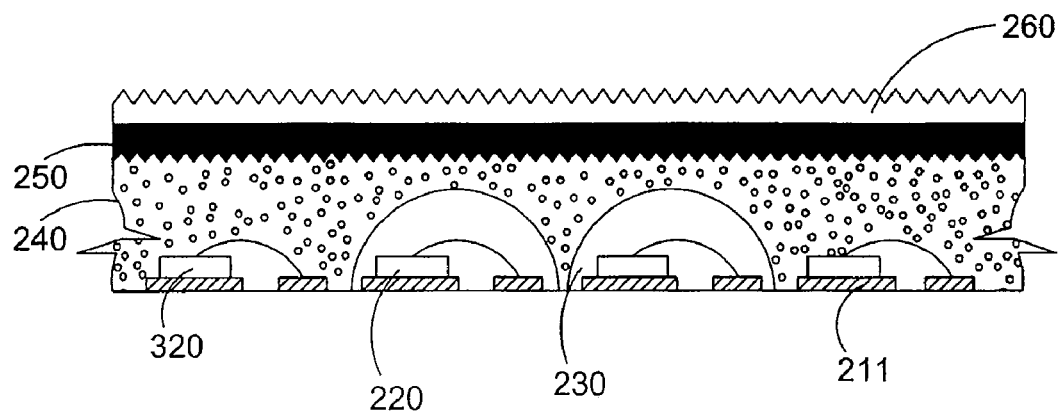

FIGS. 3A to 3C illustrate cross-sectional views of a light emitting apparatus in accordance with a second embodiment of the present invention. Different from the first embodiment, an electronic device 320 is also disposed on the patterned conductive layer 211 and embedded in the first light diffusion layer 240. The electron device 320 may be a Zener diode configured to control the light emitting device 220. FIG. 3A shows the substrate 210 having the light emitting device 220 and the electronic device 320 thereon is disposed in a fourth injection mold 321. In this embodiment, a molding material is injected into only the cavity (A), and the cavity (B) remains empty of molding material. FIG. 3B illustrates a structure after the first injection mold 331 is removed. As can be seen, the light emitting device 220 is covered by the light-transparent layer 230, and the electronic device 320 remains exposed. Similarly, the first diffusion layer 240, the second diffusion layer 250, and the prism layer 260 can be formed on the structure of FIG. 3B to complete the integrated light emitting apparatus, as shown in FIG. 3C. Preferably, a reflective layer 281 as aforementioned can be formed on the bottom surface of the structure of FIG. 3C.

Figure 4A:
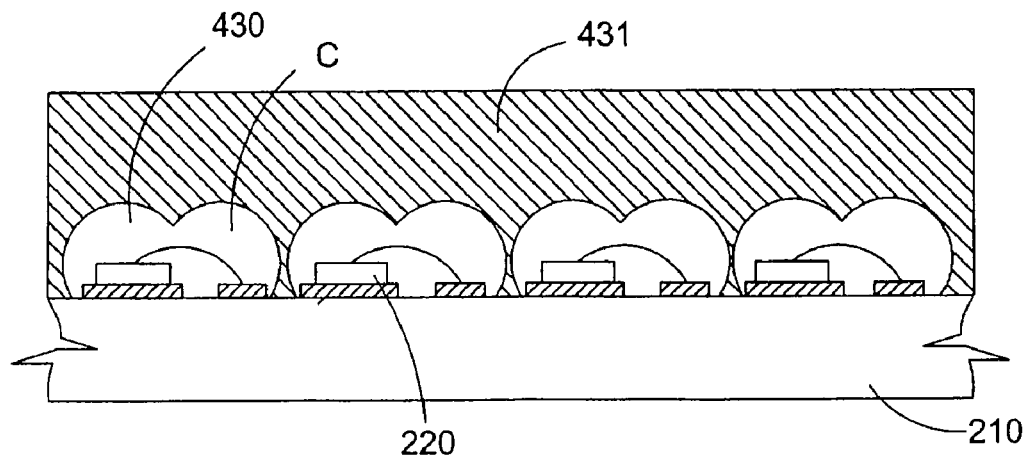
FIGS. 4A and 4B illustrate cross-sectional views of a process flow of forming a light emitting apparatus in accordance with a third embodiment of the present invention.
Figure 4B:
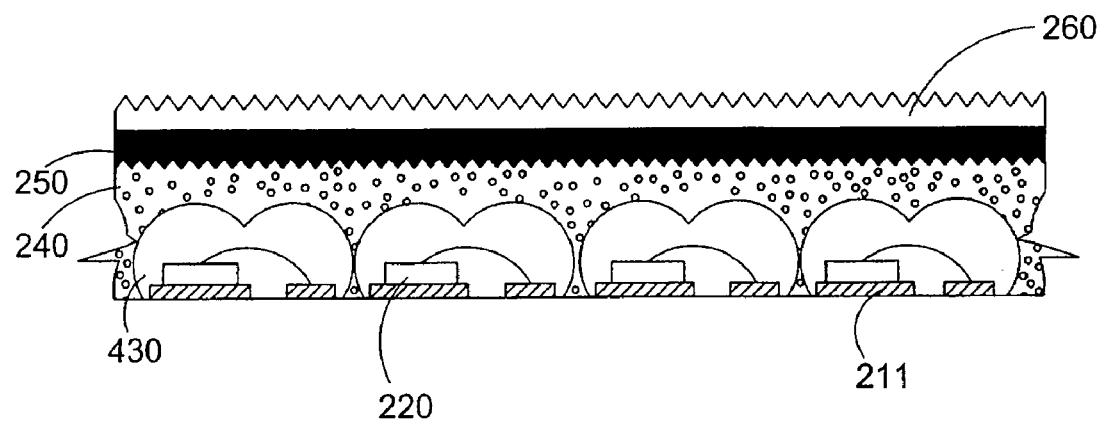

FIGS. 4A and 4B illustrate cross-sectional views of a light emitting apparatus in accordance with a third embodiment of the present invention. Different from the first embodiment, a light-transparent layer 430 of wave structure is implemented in this embodiment. As shown in FIG. 4A, a fifth injection mold 431 having a cavity (C) is provided. The cavity (C) includes an uneven inner surface, such as a wave like surface. The substrate 210 is disposed in the fifth injection mold 431, and the light emitting device 220 thereon is accommodated in the cavity (C). Then, a molding material is injected into the cavity (C), and after the molding material is cured, the fifth injection mold 431 is removed, and the wave shape light-transparent layer 430 is formed. The wave shape light-transparent layer 430 may improve the distribution of light so as to eliminate the shadow phenomenon caused by the light emitting device 220. Similarly, the first diffusion layer 240, the second diffusion layer 250, and the prism layer 260 can be formed on the light-transparent layer 430 to complete the integrated light emitting apparatus, as shown in FIG. 4B. Preferably, a reflective layer 281 as aforementioned can be formed on the bottom surface of the structure of FIG. 4B.

The detailed description of the above preferable embodiments is to describe the technical features and spirit of the present invention, and the disclosed preferable embodiments are not intended to limit the scope of the present invention. On the contrary, the preferable embodiments and their variations or equivalents all fall within the scope of the present invention. Although specific embodiments have been illustrated and described, it will be obvious to those skilled in the art that various modifications may be made without departing from what is intended to be limited solely by the appended claims.

I claim:

1. A light emitting apparatus, comprising:
   a patterned conductive layer;
   a light emitting device on the patterned conductive layer; and
   a first light diffusion layer covering the light emitting device and the patterned conductive layer, wherein the light emitting device and the patterned conductive layer are embedded in the first light diffusion layer, wherein the first light diffusion layer further includes at least one light diffusion particle therein and the light diffusion particle comprises a material selected from a group consisting of TiO2, SiO2, acrylate resin, polystyrene, and the combination thereof.

2. The apparatus according to claim 1, further comprising a light-transparent layer between the first light diffusion layer and the light emitting device, wherein the light-transparent layer covers the light emitting device so that the light emitting device is embedded in the light-transparent layer.

3. The apparatus according to claim 2, wherein the patterned conductive layer is embedded in the light-transparent layer.

4. The apparatus according to claim 2, wherein the light-transparent layer is an arc shape structure or a wave shape structure.

5. The apparatus according to claim 2, wherein the light-transparent layer comprises a material selected from a group consisting of epoxy, silicone, acrylic resin, and fluorinated resin.

6. The apparatus according to claim 1, wherein the first light diffusion layer is formed with a rough surface.

7. The apparatus of claim 1, wherein the first light diffusion layer comprises a material selected from a group consisting of polycarbonate, acrylate resin, copolymer of methyl acrylate and styrene, cyclic olefin copolymer, poly ethylene terephthalate and polystyrene.

8. The apparatus of claim 1, further comprising a prism layer covering the first light diffusion layer.

9. The apparatus of claim 8, wherein the prism layer comprises a material selected from a group consisting of polycarbonate, acrylate resin, copolymer of acrylate and styrene, cyclic olefin copolymer, poly ethylene terephthalate and polystyrene.

10. The apparatus of claim 8, further comprising a second light diffusion layer between the prism layer and the first light diffusion layer.

11. The apparatus of claim 10, wherein the second light diffusion layer comprises a material selected from a group consisting of TiO2, SiO2, acrylate resin, polystyrene.

12. The apparatus of claim 1, further comprising an electronic device on the patterned conductive layer and embedded in the first light diffusion layer, wherein the electronic device is configured to control the light emitting device.

13. The apparatus of claim 1, further comprising a heat dissipation element contacting an exposed surface of the patterned conductive layer.

* * * * *